US010480995B2

(12) United States Patent
Ishihara et al.

(10) Patent No.: US 10,480,995 B2
(45) Date of Patent: Nov. 19, 2019

(54) INFRARED DETECTION DEVICE (71) Applicant: HAMAMATSU PHOTONICS K.K., Hamamatsu-shi, Shizuoka (JP)

(72) Inventors: Masatoshi Ishihara, Hamamatsu (JP); Hiroo Yamamoto, Hamamatsu (JP); Yoshiaki Ohshige, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/550,127

(22) PCT Filed: Nov. 19, 2015

(86) PCT No.: PCT/JP2015/082579
§ 371 (c)(1),
(2) Date: Aug. 10, 2017

(87) PCT Pub. No.: WO2016/132616
PCT Pub. Date: Aug. 25, 2016

(65) Prior Publication Data
US 2018/0238733 A1    Aug. 23, 2018

(30) Foreign Application Priority Data
Feb. 18, 2015    (JP) ................................. 2015-029928

(51) Int. Cl.
*G01J 1/04*    (2006.01)
*H01L 27/14*    (2006.01)
(Continued)

(52) U.S. Cl.
CPC .............. *G01J 1/04* (2013.01); *G01J 1/0252* (2013.01); *G01J 1/4228* (2013.01); *G01J 5/06* (2013.01);
(Continued)

(58) Field of Classification Search
CPC ........... G01J 1/04; H01L 27/144; H04N 5/225
See application file for complete search history.

(56) References Cited

U.S. PATENT DOCUMENTS 4,311,906 A * 1/1982 Felix .................... H04N 3/1581
250/349
7,842,922 B2 * 11/2010 Leneke ..................... G01J 5/06
250/332
(Continued)

FOREIGN PATENT DOCUMENTS

EP        1122526 A2    8/2001
EP        2261617 A1    12/2010
(Continued)

OTHER PUBLICATIONS

International Preliminary Report on Patentability dated Aug. 31, 2017 for PCT/JP2015/082579.
(Continued)

*Primary Examiner* — Marcus H Taningco
(74) *Attorney, Agent, or Firm* — Drinker Biddle & Reath LLP (57) ABSTRACT

The signal processing board includes a plurality of signal processing circuits configured to process signals output from a plurality of pixels of an infrared detecting element. The signal processing board includes an element placement area where the infrared detecting element is placed, and a circuit placement area positioned outside the element placement area to surround the element placement area when viewed from a direction orthogonal to the signal processing board. The signal processing board includes a plurality of insulating layers that are stacked on a surface side opposing the semiconductor substrate. A plurality of signal processing circuits are placed in the circuit placement area. A heat-conducting layer is placed to be positioned on at least one of the insulating layers and in the element placement area, in
(Continued)

the signal processing board. The heat-conducting layer has a heat conductivity that is higher than a heat conductivity of the insulating layers.

8 Claims, 6 Drawing Sheets

(51) Int. Cl.
  *H01L 27/144* (2006.01)
  *H04N 5/225* (2006.01)
  *G01J 5/06* (2006.01)
  *G01J 1/02* (2006.01)
  *G01J 1/42* (2006.01)
  *G01J 5/00* (2006.01)

(52) U.S. Cl.
  CPC ............ *H01L 27/14* (2013.01); *H01L 27/144* (2013.01); *H04N 5/225* (2013.01); *G01J 2005/0077* (2013.01)

(56) References Cited

U.S. PATENT DOCUMENTS

| | | | |
|---|---|---|---|
| 8,912,578 B2* | 12/2014 | Endo | H01L 27/14632 257/222 |
| 9,911,870 B2* | 3/2018 | Sato | H01L 27/1461 |
| 2006/0091290 A1 | 5/2006 | Yoshihara et al. | |
| 2008/0216883 A1 | 9/2008 | Leneke et al. | |

FOREIGN PATENT DOCUMENTS

| | | |
|---|---|---|
| JP | H07-34334 U | 6/1995 |
| JP | 2003-152170 A | 5/2003 |
| JP | 2006-128196 A | 5/2006 |
| JP | 2008-232863 A | 10/2008 |
| JP | 2008-541102 A | 11/2008 |
| JP | 2011-142558 A | 7/2011 |
| JP | 2012-216585 A | 11/2012 |
| JP | 2013-126000 A | 6/2013 |
| WO | WO 2014/105904 A1 | 7/2014 |

OTHER PUBLICATIONS

Notice of Reasons of Rejection with English Language Translation dated Jun. 25, 2019, issued in Japanese patent application No. 2015-029928.

* cited by examiner

INFRARED DETECTION DEVICE

TECHNICAL FIELD

The present invention relates to an infrared detecting device.

BACKGROUND ART

Known infrared detecting devices include an infrared detecting element and a signal processing board (refer to Patent Literature 1, for example). The infrared detecting element includes a semiconductor substrate in which a plurality of pixels are two-dimensionally arranged. A signal processing board includes a plurality of signal processing circuits configured to process signals output from the plurality of pixels. The signal processing board is disposed to oppose the semiconductor substrate. The plurality of signal processing circuits are placed in an area opposing the semiconductor substrate.

CITATION LIST

Patent Literature

Patent Literature 1: Japanese Unexamined Patent Publication No. 2011-142558

SUMMARY OF INVENTION

Technical Problem

A signal processing circuit generates heat during operation. If a plurality of signal processing circuits are placed in an area opposing a semiconductor substrate, heat generated in the signal processing circuits is easily transferred to a semiconductor substrate (infrared detecting element). Therefore, an infrared detecting element is likely to be affected by heat provided from a signal processing board. When an infrared detecting element is affected by heat, a dark current increases.

An object of one aspect of the present invention is to provide an infrared detecting device capable of suppressing an increase in dark current.

Solution to Problem

An infrared detecting device according to one aspect of the present invention includes an infrared detecting element, a signal processing board, and a heat-conducting layer disposed in the signal processing board. The infrared detecting element includes a semiconductor substrate in which a plurality of pixels are two-dimensionally arranged. The signal processing board includes a plurality of signal processing circuits configured to process signals output from the plurality of pixels, and is disposed to oppose the semiconductor substrate. The signal processing board includes an element placement area where the infrared detecting element is placed, and a circuit placement area positioned outside the element placement area to surround the element placement area when viewed from a direction orthogonal to the signal processing board. The signal processing board includes a plurality of insulating layers stacked on a surface side opposing the semiconductor substrate. The plurality of signal processing circuits are placed in the circuit placement area to surround the element placement area. The heat-conducting layer is placed to be positioned on at least one of the plurality of insulating layers and in the element placement area. The heat-conducting layer has a heat conductivity that is higher than a heat conductivity of the plurality of insulating layers.

In the infrared detecting device according to the one aspect, the plurality of signal processing circuits are placed in the circuit placement area to surround the element placement area. In a configuration where the plurality of signal processing circuits are placed in the circuit placement area, a distance between the signal processing circuits serving as heat sources and the infrared detecting element is long, as compared with in a conventional configuration where a plurality of signal processing circuits are placed in an area immediately below an infrared detecting element (semiconductor substrate). In other words, in the infrared detecting device according to the one aspect, the infrared detecting element is far away from the signal processing circuits, as compared with in the conventional configuration, so that the infrared detecting element is not readily affected by heat provided from the signal processing board. Therefore, in the infrared detecting device according to the one aspect, an increase in dark current in the infrared detecting element is suppressed.

Also in the configuration where the plurality of signal processing circuits are placed in the circuit placement area, heat generated in the signal processing circuits is transferred to the element placement area. In which case, in the element placement area, a temperature at a position close to the signal processing circuits and a temperature at a position far from the signal processing circuits may be different from each other. In other words, temperature gradient may occur in the element placement area. For example, a temperature at a position close to the signal processing circuits is higher than a temperature at a position far from the signal processing circuits.

As a result of occurrence of temperature gradient in the element placement area, a pixel placed to oppose a position close to the signal processing circuits in the element placement area and a pixel placed to oppose a position far from the signal processing circuits in the element placement area are affected by heat provided from the signal processing board in different manners. For example, a temperature of a pixel placed to oppose a position close to the signal processing circuits in the element placement area is likely to rise, as compared with a temperature of a pixel placed to oppose a position far from the signal processing circuits in the element placement area, so that a dark current is likely to increase. Thus, dark currents may vary among pixels.

In this regard, in the infrared detecting device according to the one aspect, the heat-conducting layer having a heat conductivity that is higher than a heat conductivity of the plurality of insulating layers is disposed on the signal processing board to be positioned on at least one of the insulating layers and in the element placement area, so that temperature gradient is unlikely to occur in the element placement area. Therefore, variation in dark current among the pixels in the infrared detecting element can be suppressed.

The heat-conducting layer may include a solidly-formed metal layer. In which case, a configuration in which temperature gradient is unlikely to occur in the element placement area can be easily implemented.

The heat-conducting layer may be placed to be positioned between the two insulating layers adjacent to each other. In which case, the heat-conducting layer is placed in an inward portion of the signal processing board, as compared to a surface of the signal processing board that opposes the semiconductor substrate. Therefore, in a configuration where the heat-conducting layer is placed in an inward portion of the signal processing board, a distance between the heat-conducting layer and the infrared detecting element is long, for example, as compared with in a configuration where a heat-conducting layer is placed on a surface of a signal processing board that opposes a semiconductor substrate, so that the infrared detecting element is not readily affected by heat provided from the heat-conducting layer. Therefore, variation in dark current among pixels can be suppressed, and the increase in dark current in the infrared detecting element is further suppressed.

The signal processing board may have a rectangular shape when viewed from the direction orthogonal to the signal processing board, and the plurality of signal processing circuits may be placed along respective edges of the signal processing board in the circuit placement area. In which case, heat is transferred to the element placement area from four directions, so that temperature gradient is more unlikely to occur in the element placement area.

The element placement area may have a rectangular shape having a pair of edges that oppose each other and parallel to a pair of opposing edges of the signal processing board, and a pair of edges that oppose each other and parallel to another pair of opposing edges of the signal processing board, when viewed from the direction orthogonal to the signal processing board. A plurality of electrodes electrically connected to the respective pixels may be two-dimensionally arranged in the element placement area to correspond to arrangement of the plurality of pixels. When the element placement area includes four partial areas each having a rectangular shape, the electrodes placed in each of the four partial areas may be connected to the signal processing circuits placed along an edge of the signal processing board that opposes an edge of each of the four partial areas where the electrodes are placed. In which case, temperature gradient is unlikely to occur in the element placement area. Each of the signal processing circuits placed along each of the edges of the signal processing board and the corresponding electrode can be properly connected.

The plurality of signal processing circuits may be spaced apart from each other, and the heat-conducting layer may include a layer portion positioned between the signal processing circuits adjacent to each other when viewed from the direction orthogonal to the signal processing board. In which case, heat provided from the signal processing circuits is easily transferred to the heat-conducting layer, so that temperature gradient is more unlikely to occur in the element placement area.

The infrared detecting device may include a heat-conducting member that is disposed in the signal processing board and has a heat conductivity that is higher than a heat conductivity of the plurality of insulating layers, and the heat-conducting member may include one end connected to the heat-conducting layer and another end positioned on a back side of a surface of the signal processing board that opposes the semiconductor substrate. In which case, a part of heat of the heat-conducting layer is transferred to the back side of the surface of the signal processing board that opposes the semiconductor substrate, through the heat-conducting member. Heat transferred to the back side of the signal processing board is dissipated from the signal processing board, so that a temperature of the heat-conducting layer is reduced. Therefore, variation in dark current among pixels can be suppressed, and the increase in dark current in the infrared detecting element is further suppressed.

Advantageous Effects of Invention

According to the one aspect of the present invention, the infrared detecting device can be provided that is capable of suppressing an increase in dark current.

DESCRIPTION OF EMBODIMENTS

Hereinafter, embodiments of the present invention will be described in detail with reference to accompanying drawings. It is noted that the same components or components having the same function will be denoted by the same reference signs and redundant description will be omitted, in the following description.

Figure 1:
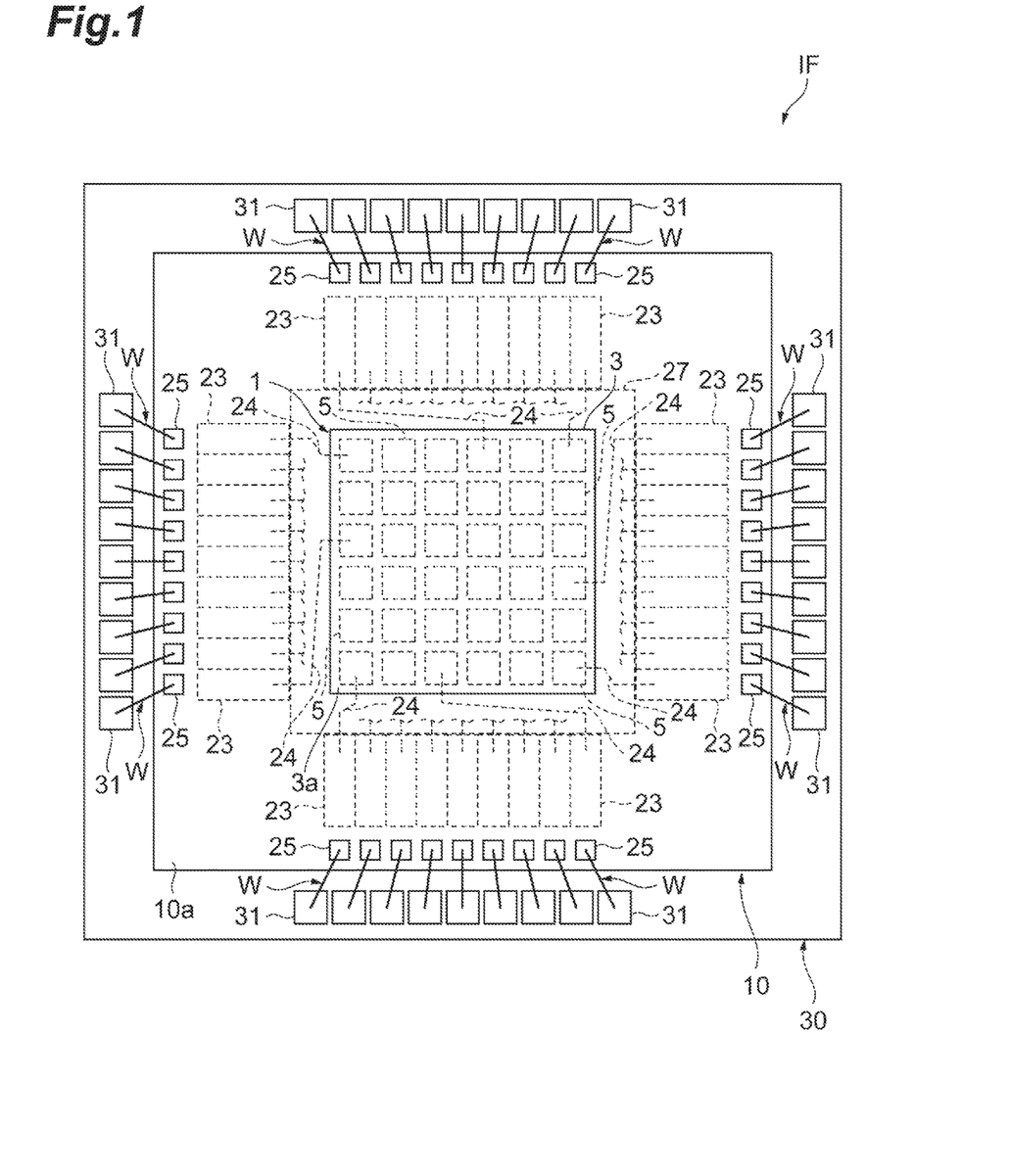
FIG. 1 is a view schematically illustrating a planar configuration of an infrared detecting device according to one embodiment.
Figure 2:
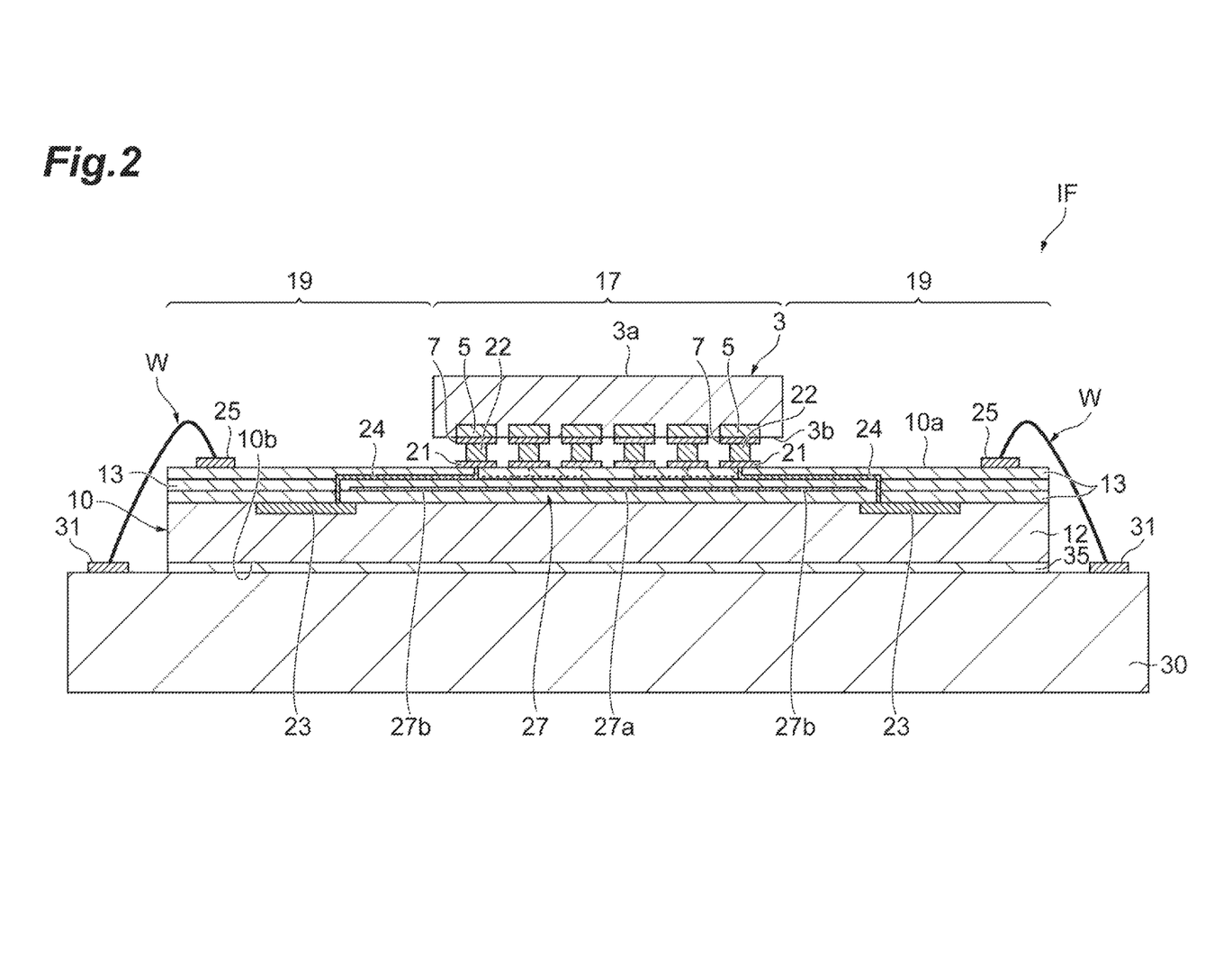
FIG. 2 is a view schematically illustrating a sectional configuration of the infrared detecting device according to the one embodiment.
Figure 3:
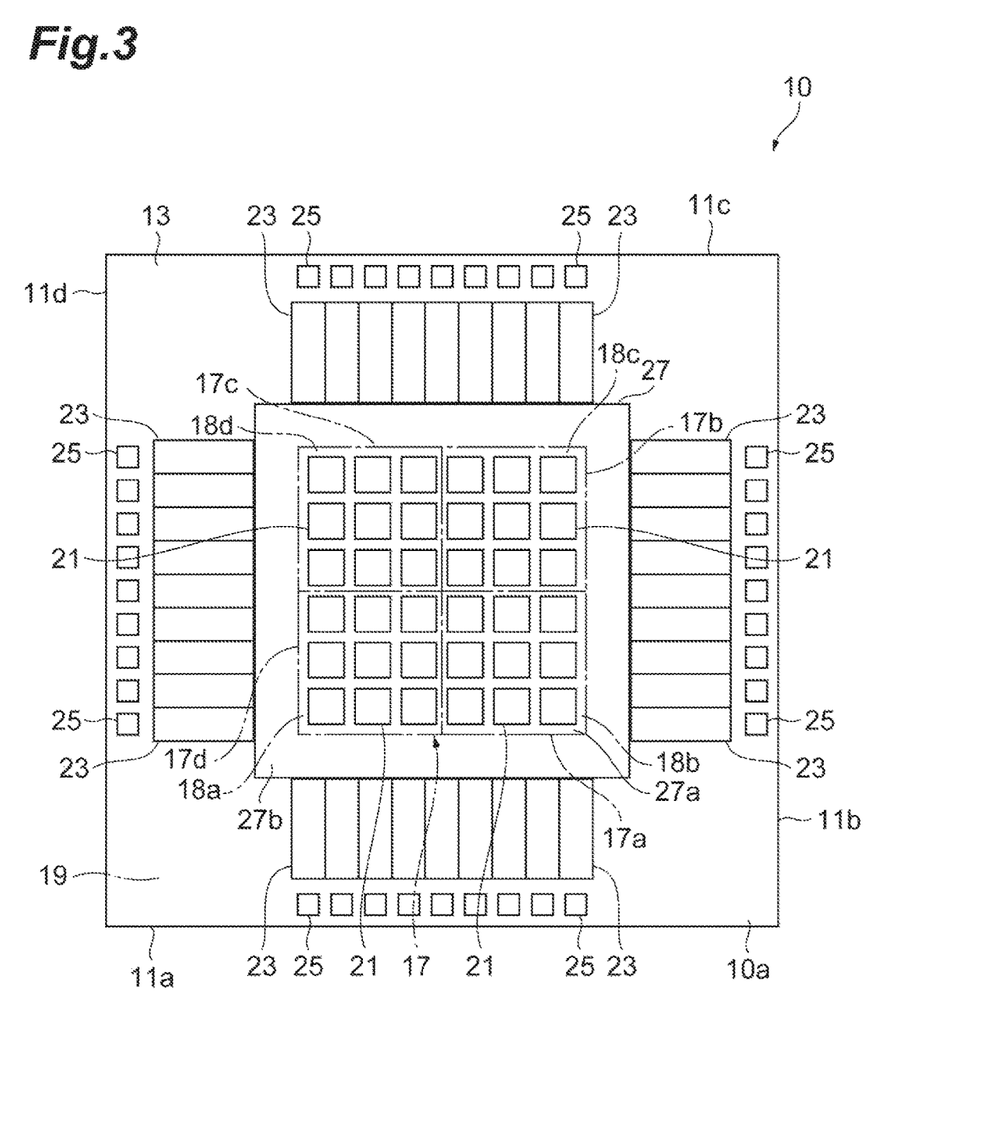
FIG. 3 is a view schematically illustrating a planar configuration of a signal processing board.

A configuration of an infrared detecting device IF according to the present embodiment will be described with reference to FIGS. 1 to 3. FIG. 1 is a view schematically illustrating a planar configuration of the infrared detecting device according to the present embodiment. FIG. 2 is a view schematically illustrating a sectional configuration of the infrared detecting device according to the present embodiment. FIG. 3 is a view schematically illustrating a planar configuration of a signal processing board.

The infrared detecting device IF includes an infrared detecting element 1, a signal processing board 10 on which the infrared detecting element 1 is mounted, and a supporting wiring board 30 on which the signal processing board 10 is mounted, as illustrated in FIGS. 1 and 2.

The infrared detecting element 1 includes a semiconductor substrate 3 having principal surfaces 3a and 3b that oppose each other. The semiconductor substrate 3 is an n-type semiconductor substrate, for example. The semiconductor substrate 3 has a rectangular shape (a square shape, for example) when viewed from a direction orthogonal to the semiconductor substrate 3 (the principal surfaces 3a and 3b), in other words, in plan view.

The infrared detecting element 1 includes a plurality of semiconductor regions 5 that are formed on a principal surface 3b side of the semiconductor substrate 3. The plurality of semiconductor regions 5 are two-dimensionally arranged. In the present embodiment, the infrared detecting element 1 includes "36 (=6 rows×6 columns)" semiconductor regions 5. Each of the semiconductor regions 5 is a p-type semiconductor region, for example. A conductivity type of the semiconductor regions 5 is different from a conductivity type of the semiconductor substrate 3. Each of the semiconductor regions 5 has a rectangular shape (a square shape, for example) in plan view. Each of the semiconductor regions 5 may have a circular shape or an oval shape, depending on a purpose of use.

In the infrared detecting element 1, the semiconductor substrate 3 and each of the semiconductor regions 5 constitute a photodiode. The photodiode constituted by the semiconductor region 5 and the semiconductor substrate 3 constitutes a pixel. Therefore, in the infrared detecting element 1, a plurality of pixels are two-dimensionally arranged. The infrared detecting element 1 can use a light receiving element that is sensitive to wavelengths in an infrared range. Such a light receiving element includes a photodiode array of compound opto-semiconductors (InGaAs, InGaAsP, InAs, InAsSb, or InSb, for example).

The infrared detecting element 1 includes a plurality of electrodes 7 that are two-dimensionally arranged to correspond to the plurality of semiconductor regions 5. In the present embodiment, the infrared detecting element 1 includes "36 (=6 rows×6 columns)" electrodes 7. Each electrode 7 is in contact with the corresponding semiconductor region 5, and functions as an anode electrode. The electrode 7 has a rectangular shape (a square shape, for example) in plan view. The electrode 7 may have a circular shape or an oval shape, depending on a purpose of use.

The signal processing board 10 includes principal surfaces 10a and 10b that oppose each other. The signal processing board 10 is placed in such a manner that the principal surface 10a opposes the principal surface 3b of the semiconductor substrate 3. The signal processing board 10 is placed to oppose the semiconductor substrate 3. The principal surface 10b is a back side of the principal surface 10a that opposes the principal surface 3b of the semiconductor substrate 3. The signal processing board 10 has a rectangular shape (a square shape, for example) in plan view. The signal processing board 10 has a pair of edges 11a and 11 b opposing each other and a pair of edges 11c and 11d opposing each other. The four edges 11a, 11 b, 11c, and 11d constitute a contour of the signal processing board 10.

The signal processing board 10 includes a plurality of insulating layers 13 that are stacked. The plurality of insulating layer 13 are positioned on a principal surface 10a side of the signal processing board 10. Each of the insulating layers 13 functions as an interlayer insulating film. In the present embodiment, the signal processing board 10 includes at least three insulating layers 13. Each of the insulating layers 13 is made of silicon oxide, for example.

As illustrated in FIG. 3, the signal processing board 10 includes an element placement area 17 and a circuit placement area 19. In the element placement area 17, the infrared detecting element 1 is placed. In other words, the element placement area 17 is positioned immediately below the infrared detecting element 1 (the semiconductor substrate 3). In the present embodiment, the element placement area 17 is positioned in a center of the signal processing board 10 when viewed from the direction orthogonal to the semiconductor substrate 3. The element placement area 17 has a rectangular shape (a square shape, for example) in plan view. In FIG. 3, illustrating of the insulating layers 13 and lines 24 which will be later described is omitted for the sake of clarification of configuration.

The element placement area 17 has a pair of edges 17a and 17b opposing each other and a pair of edges 17c and 17d opposing each other. The four edges 17a, 17b, 17c, and 17d constitute a contour of the element placement area 17. The pair of edges 17a and 17b of the element placement area 17 are parallel to the pair of edges 11a and 11b of the signal processing board 10. The pair of edges 17c and 17d of the element placement area 17 are parallel to the pair of edges 11c and 11d of the signal processing board 10.

In the element placement area 17, a plurality of electrodes 21 are placed. The plurality of electrodes 21 are two-dimensionally arranged to correspond to arrangement of the plurality of electrodes 7 (pixels). The plurality of electrodes 21 are formed on the insulating layer 13 that is positioned in an outermost surface. In the present embodiment, the signal processing board 10 includes "36 (=6 rows×6 columns)" electrodes 21. The electrodes 7 and the electrodes 21 that correspond to each other are connected via conductive bumps 22. The electrodes 21 are electrically connected to the respective pixels. The electrode 21 has a rectangular shape (a square shape, for example) in plan view. The electrode 21 may have a circular shape or an oval shape, depending on a purpose of use.

The element placement area 17 includes four partial areas 18a, 18b, 18c, and 18d each having a rectangular shape (a square shape, for example). Each of the partial areas 18a, 18b, 18c, and 18d has the same shape in plan view, and the same number of electrodes 21 are placed in each of the partial areas 18a, 18b, 18c, and 18d. In the present embodiment, "9 (=3 rows×3 columns)" electrodes 21 are placed in each of the partial areas 18a, 18b, 18c, and 18d. An electrode (cathode electrode) that is in contact with the semiconductor substrate 3 is electrically connected to an electrode (not illustrated) disposed on the signal processing board 10.

The circuit placement area 19 is positioned outside the element placement area 17 to surround the element placement area 17 when viewed from the direction orthogonal to the signal processing board 10 (the principal surfaces 10a and 10b), in other words, in plan view. The circuit placement area 19 is positioned outside the infrared detecting element 1 (the semiconductor substrate 3) when viewed from the direction orthogonal to the signal processing board 10.

The signal processing board 10 includes a plurality of signal processing circuits 23. Each of the signal processing circuits 23 processes a signal output from the corresponding pixel. In the present embodiment, the signal processing board 10 includes "36" signal processing circuits 23, correspondingly to the number of pixels. The signal processing circuits 23 include a charge amplifier circuit, a source follower circuit, or an automatic zeroing circuit, for example. Those circuits include configurations that are known to a skilled person in the present technical field, and thus a detailed description thereof is omitted. In the present embodiment, the signal processing circuits 23 are mounted on the signal processing board 10, as application specific integrated circuits (ASICs). The signal processing board 10 includes a substrate portion 12 on which the signal processing circuits 23 are mounted, and the plurality of insulating layers 13 are placed on the substrate portion 12.

The signal processing circuits 23 are electrically connected to the respective electrodes 21 through the lines 24 formed between the insulating layers 13. Therefore, a signal output from a pixel of the infrared detecting element 1 is output to the signal processing circuit 23 via the electrode 7, the conductive bump 22, the electrode 21, and the line 24 that correspond to each other.

The plurality of signal processing circuits 23 are placed in the circuit placement area 19 to surround the element placement area 17. In the present embodiment, the plurality of signal processing circuits 23 are placed along the four edges 11a, 11b, 11c and 11d of the signal processing board 10 in the circuit placement area 19.

The plurality of signal processing circuits 23 ("9" signal processing circuits 23 in the present embodiment) that are electrically connected to the plurality of electrodes 21 that are placed in the partial area 18a are placed along the edge 11a of the signal processing board 10 that opposes one edge of the partial area 18a. Those signal processing circuits 23 are positioned between the partial area 18a and the edge 11a when viewed from the direction orthogonal to the signal processing board 10. In the present embodiment, "9" signal processing circuits 23 are arranged in a single line along the edge 11a.

The plurality of signal processing circuits 23 ("9" signal processing circuits 23 in the present embodiment) that are electrically connected to the plurality of electrodes 21 that are placed in the partial area 18b are placed along the edge 11b of the signal processing board 10 that is opposed to one edge of the partial area 18b. Those signal processing circuits 23 are positioned between the partial area 18b and the edge 11b when viewed from the direction orthogonal to the signal processing board 10. In the present embodiment, "9" signal processing circuits 23 are arranged in a single line along the edge 11b.

The plurality of signal processing circuits 23 ("9" signal processing circuits 23 in the present embodiment) that are electrically connected to the plurality of electrodes 21 that are placed in the partial area 18c are placed along the edge 11c of the signal processing board 10 that is opposed to one edge of the partial area 18c. Those signal processing circuits 23 are positioned between the partial area 18c and the edge 11c when viewed from the direction orthogonal to the signal processing board 10. In the present embodiment, "9" signal processing circuits 23 are arranged in a single line along the edge 11c.

The plurality of signal processing circuits 23 ("9" signal processing circuits 23 in the present embodiment) that are electrically connected to the plurality of electrodes 21 that are placed in the partial area 18d are placed along the edge 11d of the signal processing board 10 that is opposed to one edge of the partial area 18d. Those signal processing circuits 23 are positioned between the partial area 18d and the edge 11d when viewed from the direction orthogonal to the signal processing board 10. In the present embodiment, "9" signal processing circuits 23 are arranged in a single line along the edge 11d.

In the circuit placement area 19, a plurality of electrodes 25 are placed. The plurality of electrodes 25 are placed along the four edges 11a, 11 b, 11c, and 11d of the signal processing board 10 in the circuit placement area 19. The plurality of electrodes 25 are formed on the insulating layer 13 that is positioned in an outermost surface. Though not illustrated, each of the electrodes 25 is connected to a line formed on the insulating layer 13 via a contact hole penetrating through the insulating layer 13. An output of the signal processing circuit 23 is sent to an outside of the signal processing board 10 through the foregoing line, the foregoing contact hole, and the electrode 25.

In the signal processing board 10, a heat-conducting layer 27 is placed. The heat-conducting layer 27 has a heat conductivity that is higher than a heat conductivity of the plurality of insulating layers 13. In the present embodiment, the heat-conducting layer 27 is a metal layer. A material of which the heat-conducting layer 27 is made is aluminum or copper, for example.

The heat-conducting layer 27 is placed to be positioned on at least one of the insulating layers 13 and in the element placement area 17. In the present embodiment, the heat-conducting layer 27 is placed to be positioned between the two insulating layers 13 adjacent to each other. The heat-conducting layer 27 is not exposed from the signal processing board 10, and is positioned in the signal processing board 10.

Figure 4:
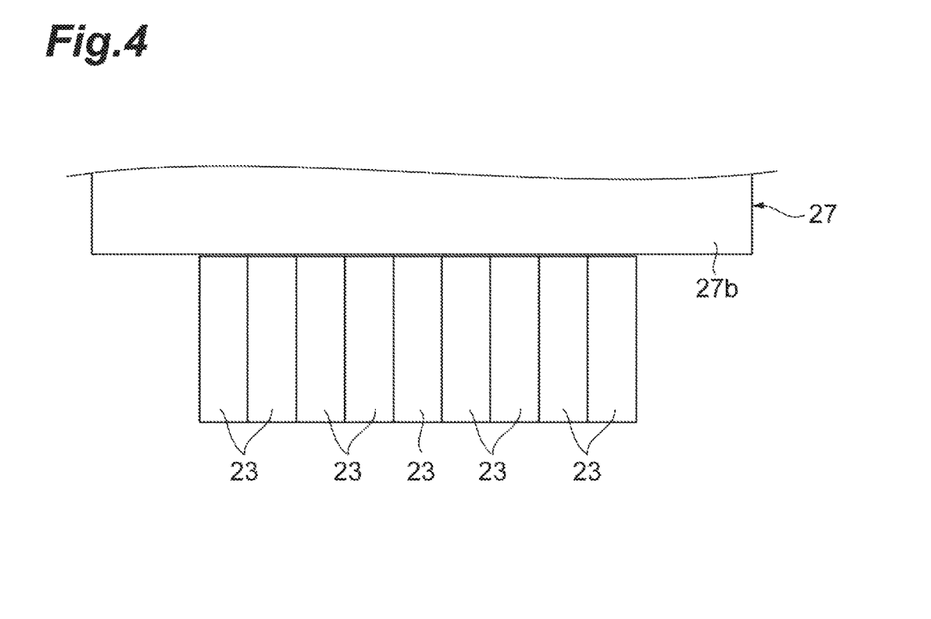
FIG. 4 is a view schematically illustrating a positional relationship between signal processing circuits and a heat-conducting layer.

A portion of the heat-conducting layer 27 is positioned in the circuit placement area 19. The heat-conducting layer 27 includes a layer portion 27a that is positioned in the element placement area 17, and a layer portion 27b that is positioned in the circuit placement area 19. The layer portion 27a has the same rectangular shape (a square shape, for example) as the element placement area 17 in plan view. The layer portion 27b is positioned outside the layer portion 27a to surround the layer portion 27a in plan view. An end of the heat-conducting layer 27 (the layer portion 27b) substantially coincides with an end of the signal processing circuits 23 when viewed from the direction orthogonal to the signal processing board 10, as illustrated in FIG. 4. In FIG. 4, for the sake of clarification of configuration, illustrating of the insulating layers 13, the lines 24, and the like is omitted, and only the heat-conducting layer 27 and the signal processing circuits 23 are illustrated.

The heat-conducting layer 27 is solidly formed. In the present embodiment, the heat-conducting layer 27 has a rectangular shape (a square shape, for example) in plan view. The heat-conducting layer 27 is not necessarily required to be solidly formed. For example, the heat-conducting layer 27 may be formed in a grid pattern. A plurality of openings may be formed in the heat-conducting layer 27. The heat-conducting layer 27 is connected at a ground potential through a line not illustrated.

The supporting wiring board 30 includes a plurality of electrodes 31 and an electrode 35. The plurality of electrodes 31 and the electrode 35 are disposed on a surface on which the signal processing board 10 is mounted. Each of the electrodes 31 is electrically connected to the corresponding electrode 25. The electrode 31 and the electrode 25 are electrically connected to each other by a bonding wire W. The electrode 35 is in contact with a principal surface 10b side of the signal processing board 10.

As described above, in the present embodiment, the plurality of signal processing circuits 23 are placed in the circuit placement area 19 positioned outside the element placement area 17 to surround the element placement area 17. In a configuration where the plurality of signal processing circuits 23 are placed in the circuit placement area 19, a distance between the signal processing circuits 23 serving as heat sources and the infrared detecting element 1 is long, as compared with in a conventional configuration where a plurality of signal processing circuits 23 are placed in an area positioned immediately below an infrared detecting element. In the infrared detecting device IF, the infrared detecting element 1 is far away from the signal processing circuits 23, as compared with in the conventional configuration, so that the infrared detecting element 1 is not readily affected by heat provided from the signal processing board 10. Therefore, in the infrared detecting device IF, an increase in dark current in the infrared detecting element 1 can be suppressed.

A dark current occurring in the infrared detecting element 1 has temperature dependence. The dark current increases as a temperature of the infrared detecting element 1 rises, and the dark current decreases as a temperature of the infrared detecting element 1 is reduced. In the present embodiment, the infrared detecting element 1 is not necessarily required to be cooled by a cooling device (a Peltier device, for example).

Also in the configuration where the plurality of signal processing circuits 23 are placed in the circuit placement area 19, heat generated in the signal processing circuits 23 is transferred to the element placement area 17. In which case, in the element placement area 17, a temperature at a position close to the signal processing circuits 23 and a temperature at a position far from the signal processing circuits 23 may be different from each other. In other words, temperature gradient may occur in the element placement area 17. For example, a temperature at a position close to the signal processing circuits 23 is higher than a temperature at a position far from the signal processing circuits 23.

As a result of occurrence of temperature gradient in the element placement area 17, a pixel placed to oppose a position close to the signal processing circuits 23 in the element placement area 17 and a pixel placed to oppose a position far from the signal processing circuits 23 in the element placement area 17 are affected by heat provided from the signal processing board 10 in different manners. For example, in a pixel placed to oppose a position close to the signal processing circuits 23 in the element placement area 17, as compared with in a pixel placed to oppose a position far from the signal processing circuits 23 in the element placement area 17, a temperature is likely to rise, so that the dark current may increase. The dark currents may vary among the pixels of the infrared detecting element 1.

In this regard, in the infrared detecting device IF, the heat-conducting layer 27 is disposed on the signal processing board 10 to be positioned on at least one of the insulating layers 13 and in the element placement area 17. Therefore, in the infrared detecting device IF including the heat-conducting layer 27, heat provided from the signal processing circuits 23 is easily transferred to the element placement area 17, for example, as compared with in an infrared detecting device not including the heat-conducting layer 27, so that temperature gradient is unlikely to occur in the element placement area 17. Consequently, variation in dark current among the pixels in the infrared detecting element 1 can be suppressed.

Also in the conventional configuration, a temperature distribution in the area positioned immediately below the infrared detecting element 1 becomes substantially uniform as a time elapses since a start of driving of the infrared detecting device IF, and thus, it is considered that temperature gradient becomes nonexistent in the element placement area 17. In this regard, in the infrared detecting device IF including the heat-conducting layer 27, a time period required for a temperature distribution in the element placement area 17 to become substantially uniform is short, for example, as compared with in an infrared detecting device not including the heat-conducting layer 27. Therefore, in the infrared detecting device IF, a time period during which variation in dark current among the pixels of the infrared detecting element 1 occurs is relatively short. Consequently, detection results provided in the infrared detecting device IF is less affected by variation in dark current. As a result of this, in the infrared detecting device IF, more accurate infrared detection can be achieved.

The heat-conducting layer 27 includes a solidly-formed metal layer. In which case, the heat-conducting layer 27 can be formed by the same process as the lines 24 formed between the insulating layers 13. Therefore, a configuration in which temperature gradient is unlikely to occur in the element placement area 17 can be easily implemented. The heat-conducting layer 27 is solidly formed, so that heat generated in the signal processing circuits 23 can be effectively transferred to the element placement area 17.

The heat-conducting layer 27 is placed to be positioned between the two insulating layers 13 adjacent to each other. In which case, the heat-conducting layer 27 is positioned in an inward portion of the signal processing board 10, as compared to a surface of the signal processing board 10 that opposes the infrared detecting element 1 (the semiconductor substrate 3). When the heat-conducting layer 27 is positioned in an inward portion of the signal processing board 10, a distance between the heat-conducting layer 27 and the infrared detecting element 1 is long, for example, as compared with when the heat-conducting layer 27 is placed on a surface of the signal processing board 10 that opposes the infrared detecting element 1, so that the infrared detecting element 1 is not readily affected by heat provided from the heat-conducting layer 27. Therefore, in the infrared detecting device IF, variation in dark current among the pixels can be suppressed, and the increase in dark current in the infrared detecting element 1 is further suppressed.

The signal processing board 10 has a rectangular shape in plan view. The plurality of signal processing circuits 23 are placed along the respective edges 11a, 11b, 11c, and 11d of the signal processing board 10, in the circuit placement area 19. In which case, heat is transferred to the element placement area 17 from directions of the respective edges 11a, 11b, 11c, and 11d, that is, from four directions, so that temperature gradient is more unlikely to occur in the element placement area 17, in the infrared detecting device IF.

The element placement area 17 has a rectangular shape having the four edges 17a, 17b, 17c, and 17d in plan view. In the element placement area 17, the plurality of electrodes 21 are two-dimensionally arranged to correspond to arrangement of a plurality of pixels in the infrared detecting element 1. The element placement area 17 includes the four rectangular partial areas 18a, 18b, 18c, and 18d. The electrodes 21 placed in each of the four partial areas 18a, 18b, 18c, and 18d are connected to the signal processing circuits 23 that are placed along the respective edges 11a, 11b, 11c, and 11d of the signal processing board 10 that opposes one edge of each of the partial areas 18a, 18b, 18c, and 18d. Therefore, temperature gradient is unlikely to occur in the element placement area 17. Each of the signal processing circuits 23 that are placed along each of the edges 11a, 11b, 11c, and 11d of the signal processing board 10 can be properly connected to the corresponding electrode 21.

The end of the heat-conducting layer 27 and the end of the signal processing circuits 23 are not necessarily required to coincide with each other when viewed from the direction orthogonal to the signal processing board 10. For example, when viewed from the direction orthogonal to the signal processing board 10, the end of the heat-conducting layer 27 and the end of the signal processing circuits 23 may be far away from each other, or the end of the heat-conducting layer 27 may overlap the signal processing circuits 23. When the end of the heat-conducting layer 27 and the end of the signal processing circuits 23 are far away from each other when viewed from the direction orthogonal to the signal processing board 10, heat provided from the signal processing circuits 23 is hard to transfer to the heat-conducting layer 27, as compared with when the end of the heat-conducting layer 27 and the end of the signal processing circuits 23 substantially coincide with each other when viewed from the direction orthogonal to the signal processing board 10. When the end of the heat-conducting layer 27 overlaps the signal processing circuits 23, stray capacitance is generated between the heat-conducting layer 27 and the signal processing circuits 23, and the generated stray capacitance may affect characteristics of the signal processing circuits 23.

Figure 5:
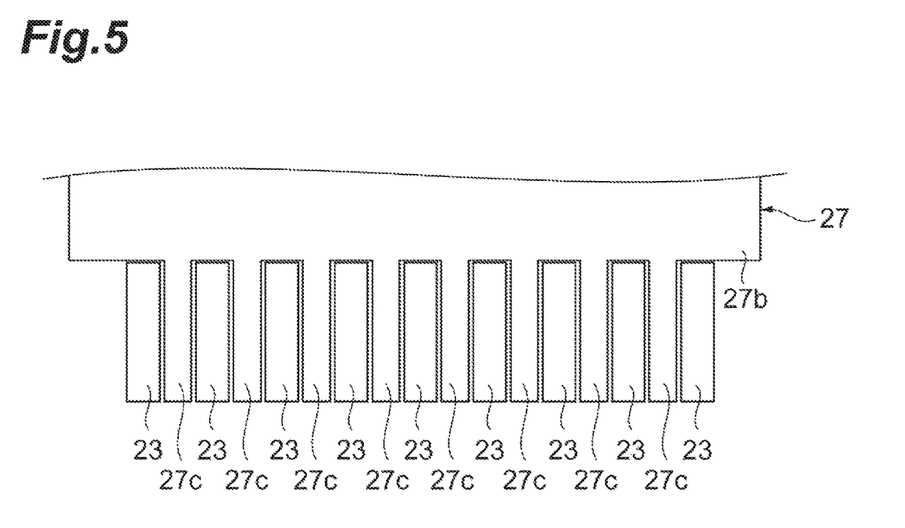
FIG. 5 is a view schematically illustrating a positional relationship between signal processing circuits and a heat-conducting layer.

Next, referring to FIG. 5, a configuration of a modification of the infrared detecting device IF will be described. FIG. 5 is a view schematically illustrating a positional relationship between signal processing circuits and a heat-conducting layer. In the present modification, a configuration of the heat-conducting layer 27 is different from that in the above-described embodiment. In FIG. 5, like FIG. 4, only the heat-conducting layer 27 and the signal processing circuits 23 are illustrated for the sake of clarification of configuration.

As illustrated in FIG. 5, the plurality of signal processing circuits 23 are spaced from each other in a direction of arrangement. The heat-conducting layer 27 includes the layer portion 27a, the layer portion 27b, and a plurality of layer portions 27c. The plurality of layer portions 27c are positioned in the circuit placement area 19. Each of the layer portions 27c is positioned between the signal processing circuits 23 adjacent to each other when viewed from the direction orthogonal to the signal processing board 10.

When the heat-conducting layer 27 includes the layer portions 27c each positioned between the signal processing circuits 23 adjacent to each other when viewed from the direction orthogonal to the signal processing board 10, heat provided from the signal processing circuits 23 are transferred to the layer portions 27c, and is further transferred from the layer portions 27c to the layer portion 27a through the layer portions 27b. This allows heat provided from the signal processing circuits 23 to be easily transferred to the heat-conducting layer 27, so that temperature gradient is more unlikely to occur in the element placement area 17. The layer portion 27a, the layer portion 27b, and each of the layer portions 27c may be positioned between the same insulating layers 13, or may be positioned on the different insulating layers 13.

Figure 6:
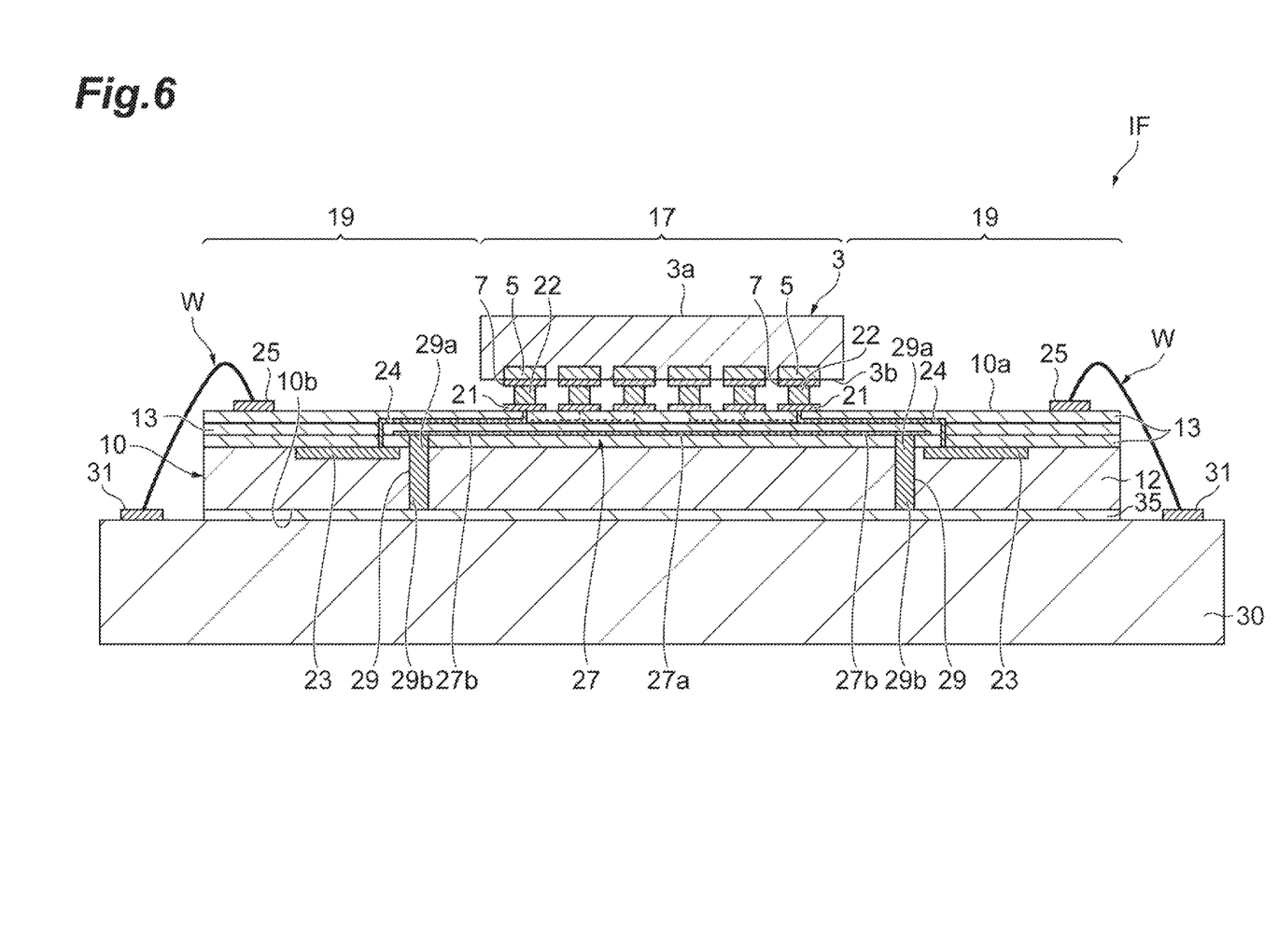
FIG. 6 is a view schematically illustrating a sectional configuration of an infrared detecting device according to a modification of the one embodiment.

Next, referring to FIG. 6, a configuration of the modification of the infrared detecting device IF will be described. FIG. 6 is a view schematically illustrating a sectional configuration of an infrared detecting device according to the present modification.

The infrared detecting device IF illustrated in FIG. 6 includes the infrared detecting element 1, the signal processing board 10, and the supporting wiring board 30.

A plurality of heat-conducting members 29 are disposed on the signal processing board 10. Each of the heat-conducting members 29 includes one end 29a connected to the heat-conducting layer 27 and another end 29b positioned on the principal surface 10b side of the signal processing board 10. The heat-conducting members 29, like the heat-conducting layer 27, have a heat conductivity that is higher than the heat conductivity of the plurality of insulating layers 13. In the present embodiment, the heat-conducting members 29 are metal members. A material of which the heat-conducting members 29 are made is aluminum or copper, for example.

The heat-conducting members 29 are formed to penetrate through the substrate portion 12 in a thickness direction of the signal processing board 10. The one ends 29a and the other ends 29b of the heat-conducting members 29 are exposed from the substrate portion 12. The other ends 29b of the heat-conducting members 29 are connected to the electrode 35. As a result of the electrode 35 being connected at a ground potential, a ground potential is given to the heat-conducting layer 27 through the heat-conducting members 29.

A part of heat of the heat-conducting layer 27 is transferred to the principal surface 10b side of the signal processing board 10 through the heat-conducting members 29. Heat transferred to the principal surface 10b side is dissipated from the signal processing board 10, so that a temperature of the heat-conducting layer 27 is reduced. Therefore, in the present modification, variation in dark current among the pixels can be suppressed, and the increase in dark current in the infrared detecting element 1 is further suppressed.

Although the embodiments of the present invention have been described as above, the present invention is not necessarily limited to the above-described embodiments, and various modifications are possible within the scope of the subject matter thereof.

Respective shapes of the semiconductor substrate 3, the semiconductor region 5, the signal processing board 10, the element placement area 17, the heat-conducting layer 27, the electrodes 7 and 21 are not limited to the above-described shapes. Those shapes may be circular shapes, for example. The respective numbers of the semiconductor regions 5, the electrodes 7 and 21, and the signal processing circuits 23 are not limited to the above-described numbers.

INDUSTRIAL APPLICABILITY

The present invention is applicable to an infrared detecting device.

REFERENCE SIGNS LIST

1 . . . infrared detecting element, 3 . . . semiconductor substrate, 5 . . . semiconductor region, 10 . . . signal processing board, 11a, 11b, 11c, 11d . . . edge of signal processing board, 13 . . . insulating layer, 17 . . . element placement area, 17a, 17b, 17c, 17d . . . edge of element placement area, 18a, 18b, 18c, 18d . . . partial area, 19 . . . circuit placement area, 21 . . . electrode, 23 . . . signal processing circuit, 27 . . . heat-conducting layer, 27a, 27b, 27c . . . layer portion, 29 . . . heat-conducting member, 30 . . . supporting wiring board, IF . . . infrared detecting device.

The invention claimed is:

1. An infrared detecting device comprising:
an infrared detecting element including a semiconductor substrate in which a plurality of pixels are two-dimensionally arranged;
a signal processing board including a plurality of signal processing circuits configured to process signals output from the plurality of pixels, the signal processing board being disposed to oppose the semiconductor substrate; and
a heat-conducting layer disposed in the signal processing board, wherein
the signal processing board includes an element placement area where the infrared detecting element is placed, and a circuit placement area positioned outside the element placement area to surround the element placement area when viewed from a direction orthogonal to the signal processing board, and includes a plurality of insulating layers stacked on a surface side opposing the semiconductor substrate,
in the element placement area, a plurality of electrodes electrically connected to a corresponding pixel of the plurality of pixels are arranged,
the plurality of signal processing circuits are placed only in the circuit placement area to surround the element placement area, each signal processing circuit being electrically connected to a corresponding electrode of the plurality of electrodes though a conductive line, the signal processing board is configured to output a signal output from the pixel to the signal processing circuit though the electrode and conductive line corresponding the pixel, and the heat-conducting layer is placed to be positioned on at least one of the plurality of insulating layers and in the element placement area, and has a heat conductivity that is higher than a heat conductivity of the plurality of insulating layers.

2. The infrared detecting device according to claim 1, wherein
the heat-conducting layer includes a solidly-formed metal layer.

3. The infrared detecting device according to claim 1, wherein
the heat-conducting layer is placed to be positioned between two of the plurality of insulating layers that are adjacent to each other.

4. The infrared detecting device according to claim 1, wherein
the signal processing board has a rectangular shape when viewed from the direction orthogonal to the signal processing board, and
the plurality of signal processing circuits are placed along respective edges of the signal processing board in the circuit placement area.

5. The infrared detecting device according to claim 4, wherein
the element placement area has a rectangular shape having a pair of edges that oppose each other and parallel to a pair of opposing edges of the signal processing board, and a pair of edges that oppose each other and parallel to another pair of opposing edges of the signal processing board, when viewed from the direction orthogonal to the signal processing board, the plurality of electrodes are two-dimensionally arranged in the element placement area to correspond to arrangement of the plurality of pixels, and when the element placement area includes four partial areas each having a rectangular shape, the electrodes placed in each of the four partial areas are connected to the signal processing circuits placed along an edge of the signal processing board that opposes an edge of each of the four partial areas where the electrodes are placed.

6. The infrared detecting device according to claim 1, wherein
the plurality of signal processing circuits are spaced apart from each other, and
the heat-conducting layer includes a layer portion positioned between the signal processing circuits adjacent to each other when viewed from the direction orthogonal to the signal processing board.

7. The infrared detecting device according to claim 1, further comprising:
a heat-conducting member disposed in the signal processing board, the heat-conducting member having a heat conductivity that is higher than the heat conductivity of the plurality of insulating layers, wherein
the heat-conducting member includes one end connected to the heat-conducting layer and another end positioned on a back side of a surface of the signal processing board that opposes the semiconductor substrate.

8. The infrared detecting device according to claim 1, wherein the heat-conducting layer is configured to transfer heat provided from the signal processing circuits to the element placement area.

* * * * *